United States Patent [19]

Stemmons et al.

[11] Patent Number: 4,839,531

[45] Date of Patent: Jun. 13, 1989

[54] COMPUTER NETWORK INTERCONNECTING APPARATUS

[75] Inventors: Duane G. Stemmons, Wichita; John P. Noonan, Derby, both of Kans.

[73] Assignee: The Boeing Company, Seattle, Wash.

[21] Appl. No.: 108,069

[22] Filed: Oct. 14, 1987

[51] Int. Cl.⁴ .......................... H02J 3/00; H03H 5/00
[52] U.S. Cl. ........................................ 307/17; 333/25
[58] Field of Search .................. 307/17; 343/821, 859; 333/25, 32; 340/825.5; 174/34, 36

[56] References Cited

U.S. PATENT DOCUMENTS

| | | | |
|---|---|---|---|
| 2,754,415 | 7/1956 | Schmidt, Jr. | 333/25 |
| 3,066,266 | 11/1962 | Fisher | 333/25 |
| 4,631,504 | 12/1986 | Matsuda et al. | 333/25 |
| 4,697,051 | 9/1987 | Beggs et al. | 174/34 X |
| 4,717,896 | 1/1988 | Graham | 333/25 |
| 4,755,629 | 7/1988 | Beggs et al. | 174/34 |

Primary Examiner—William M. Shoop, Jr.
Assistant Examiner—Sharon D. Logan
Attorney, Agent, or Firm—Finnegan, Henderson, Farabow, Garrett & Dunner

[57] ABSTRACT

An interconnect device permits use of 150 ohm twisted pair transmission lines to interconnect computers designed for use with 75 ohm coaxial cable. The device includes a pair of toroidal transformers mounted in an aluminum housing and separated by a Faraday shield. The primary winding of each transformer is connected to a separate coaxial connector. The second winding of each transformer is connected over a separate a twisted conductor pair to one terminal of a balanced data connector assembly.

7 Claims, 3 Drawing Sheets

COMPUTER NETWORK INTERCONNECTING APPARATUS

BACKGROUND OF THE INVENTION

The invention relates to computer networks and, more particularly, to apparatus for interconnecting a plurality of computing components in a network As computer use increases in business and industrial environments, there is a corresponding increase in the distribution of computer usage and computing power away from a central mainframe location. In some instances, users scattered throughout a large building will access a mainframe computer through terminals distributed throughout the building and connected to the mainframe by a cable network. In other applications, cable networks are also used to interconnect small computers distributed throughout a building with each other and with shared resources such as mass storage and printing devices.

Installation of cable networks may constitute a significant portion of the total cost of such computer systems. To reduce these installation costs, a cable network is often set in place during construction of the building. This technique can significantly lower the installation cost. However, there is no agreed upon standard for computer system cable networks. That is, various systems have different requirements as to the number of conductors, the type of conductors, the characteristic impedences, etc. For example, some systems require a 150 ohm balanced, twisted conductor pair for interconnection, while other systems employ a 75 ohm unbalanced colaxial cable for interconnection.

If a certain type of cable network is installed in a building during construction and a decision is made after construction to add a computer system which is not compatable with the installed network, much of the cost savings gained by installation of the network during construction can be lost.

Methods and techniques are known for connecting computers and terminals to incompatable cable networks. However, existing techniques have not proven satisfactory in many applications.

SUMMARY OF THE INVENTION

It is an object of the present invention to provide apparatus for interconnecting computer system components designed for coaxial interconnection systems with existing balanced, twisted pair cable networks.

It is a further object of the invention to provide such apparatus which exhibits low cost and which provides no performance penalties.

Additional objects and advantages of the invention will be set forth in part in the description which follows and, in part, will be obvious from he description or may be learned by practice of the invention. The objects and advantages of the invention will be realized and attained by means of the instrumentalities and combinations particularly pointed out in the appended claims.

To achieve the objects and in accordance with the purpose of the invention, as embodied and broadly described herein, the invention comprises an apparatus for interconnecting a computer to a network. The apparatus includes a housing of conductive material; a pair of toroidal transformers mounted in the housing, with each of the transformers comprising a toroidal core of ferrite material, a balanced winding, and an unbalanced winding; a pair of first connection means for receiving a balanced conductor, each of the first connection means being connected to a separate one of the balanced windings; and a pair of second connecting means mounted on the housing for receiving an unbalanced conductor, each of the second connection means being connected to a separate one of the unbalanced windings.

The accompanying drawings, which are incorporated in and constitute a part of the specification, illustrate one embodiment of the invention and, together with the description, serve to explain the principles of the invention.

DETAILED DESCRIPTION OF THE PREFERRED EMBODIMENT

Figure 1:
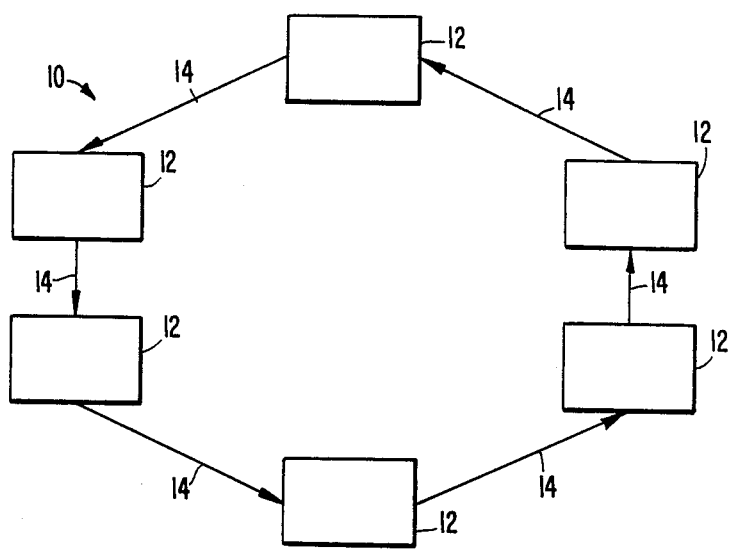
FIG. 1 is a block diagram of a prior art computer system containing components interconnected by a cable network.

Reference will be made in detail to the presently preferred embodiment of the invention, an example of which is illustrated in FIGS. 3–6. Reference also will be made to the conventional systems illustrated in FIGS. 1 and 2. Throughout the drawings, like reference characters are used to indicate like elements.

FIG. 1 shows a computer system or network 10 10 including a plurality of computing components 12. Components 12 may constitute individual stand-alone computers, a mainframe computer and a plurality of terminals, peripheral devices such as disk drives and printers, or a combination of the above. In each case, components 12 are connected in a loop by cables 14. Data generated by one component 12 to be received by another component 12 is thus placed on an outgoing cable 14 in the direction shown by arrows on cables 14. It is then received and retransmitted by each component 12 in turn until it reaches the destination component. The destination component 12 acts on the received data and does not retransmit it around the loop.

Figure 2:
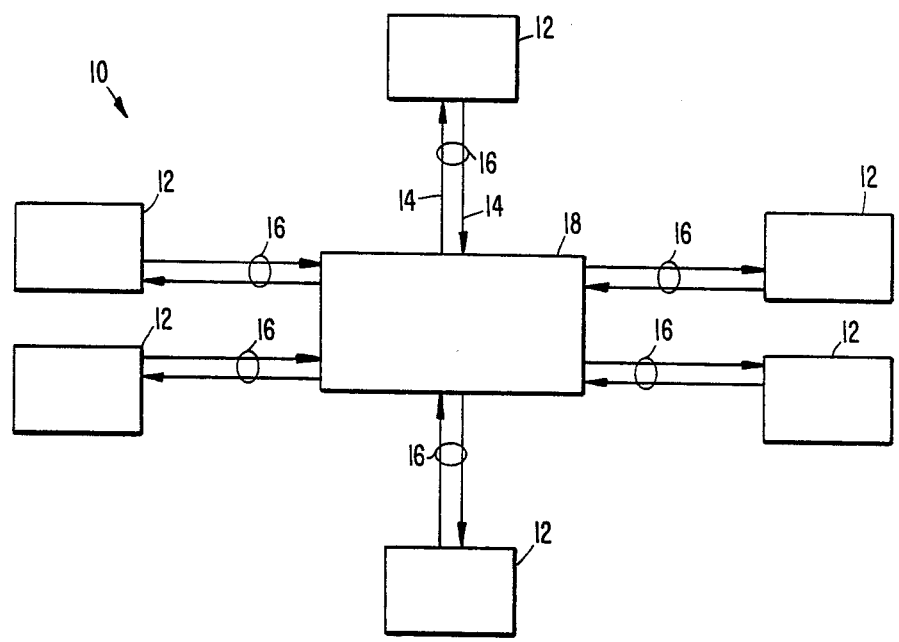
FIG. 2 is a block diagram of a prior art alternative interconnection arrangement for the computer system of FIG. 1.

It can be appreciated that if there is a failure of any component 12 of network 10, the entire network is rendered inoperable. Accordingly, the network 10 is usually configured in a manner such as shown in FIG. 2, in which components 12 are still electrically connected in a loop, but incoming and outgoing cables 14 from each component 12 are formed into a bidirectional transmission line 16 and are brought to a central patch panel 18. Thus, if it is necessary to remove one component 12 from the system, the portion of the loop associated with the removed component can be short-circuited at patch panel 18 to maintain the integrity of the loop. Conductors 14 may constitute a twisted pair of conductors having 150 ohm impedance. Transmission line 18, shown in FIG. 2, may thus constitute two such twisted pairs, enclosed in a shield.

A complication exists where components 12 are designed to receive and transmit from an unbalanced coaxial transmission line. Accordingly, the present invention provides a means for interconnecting a cable network of one configuration to a computer designed to transmit and receive data from another cable configuration. An interconnect device 30 which constitutes a preferred embodiment of the invention is shown in FIG. 3.

Figure 3:
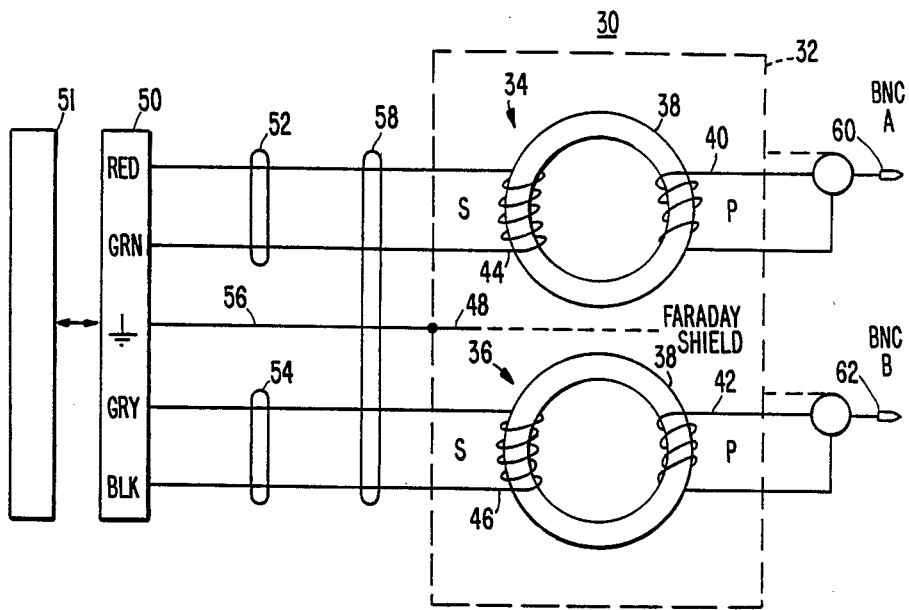
Fig. 3 is a schematic diagram of an interconnect device which constitutes a preferred embodiment of the present invention.

Device 30 includes a housing of aluminum or other electrically conducting material indicated in FIG. 3 at 32. A pair of toroidal transformers 34 and 36 are mounted in housing 32 and each include a toroidal core 38 of ferrite material, an unbalanced primary winding 40,42 and a balanced secondary winding 44,46. A conductive barrier 48 is formed in housing 32 between transformers 34 and 36 and constitutes a Faraday shield.

Figure 5:
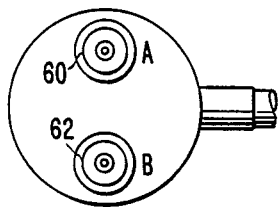
FIG. 5 is a top-view of a portion of the device shown in FIG. 4 viewed along line vv.
Figure 4:
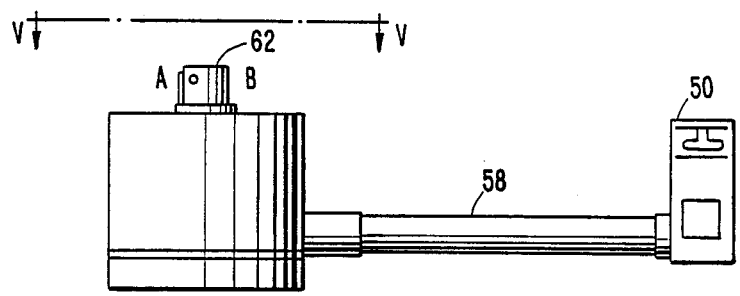
FIG. 4 is a side-view of the device of FIG. 3.

FIGS. 4 and 5 show the physical configuration of device 30. The invention includes a pair of first connection means for receiving a balanced conductor, with each of the first connection means being connected to a separate one of the balanced windings. As embodied herein, the pair of first connection means comprises a data connector 50 adapted for insertion into a corresponding data connector 51. Data connectors 50 and 51 each consist of a loop-back connector connected to two balanced 150 ohm twisted conductor pairs enclosed in a shield, which constitute the cable network. Data connectors 50 and 51 may comprise IBM type 8310574 data connectors.

When connector assembly 50 is inserted into a corresponding data connector 51, the two twisted conductor pairs are electrically connected to two corresponding twisted conductor pairs 52,54 respectively connected to secondary windings 44 and 46. Conductor pairs 52 and 54, together with a shield 56, constitute a cable 58 connecting data connector 50 with secondary windings 44 and 46. Shield 56 is connected to Faraday shield 48. When data connector 50 is removed from the associated data connector 51, one twisted pair coming into the data connector 51 is electrically connected to the other twisted pair, such that removal of data connector 50 is operable to cause the associated data connector 51 to maintain loop integrity by connecting the one pair of the cable network to the other pair.

The invention further includes a pair of second connection means mounted on the housing for receiving an unbalanced conductor, with each of the second connection means being connected to a separated one of the unbalanced windings. As embodied herein, the pair of second connection means comprises a pair of BNC coaxial cable connectors 60, 62.

In the preferred embodiment, device 30 is used to interconnect computers manufactured by the Apollo Corporation, which are designed to send and receive data over 75 ohm unbalanced coaxial cables, using a transmission line consisting of two 150 ohm twisted conductor pairs.

In the preferred embodiment, ferrite cores 38 consist of ½ inch diameter cores constructed of ferrite material, such as the type FT-50-75 high permeability cores commercially available from Amidon Associates of North Hollywood, Calif. Primary windings 40 and 42, in the preferred embodiment, each consist of fourteen turns of helically wound 26 gauge insulated copper wire. Secondary windings 44 and 46 each consist of twenty turns of helically wound 30 gauge insulated copper wire.

The turns ratio n of primary and secondary windings 40,42 and 44,46 is determined by the desired impedance matching characteristics of the cables connected to the windings. Thus, $$n = \sqrt{\frac{Zs}{Zp}},$$

where Zs is the impedance of the secondary winding cable and Zp is the impedance of the primary winding. The particular number of turns for each winding, given the turns ratio, is determined experimentally.

In the preferred embodiment, transformers 34 and 36 are secured within housing 32 using an insulating adhesive such as RTV silicon rubber commercially available from the General Electric Company.

Figure 6:
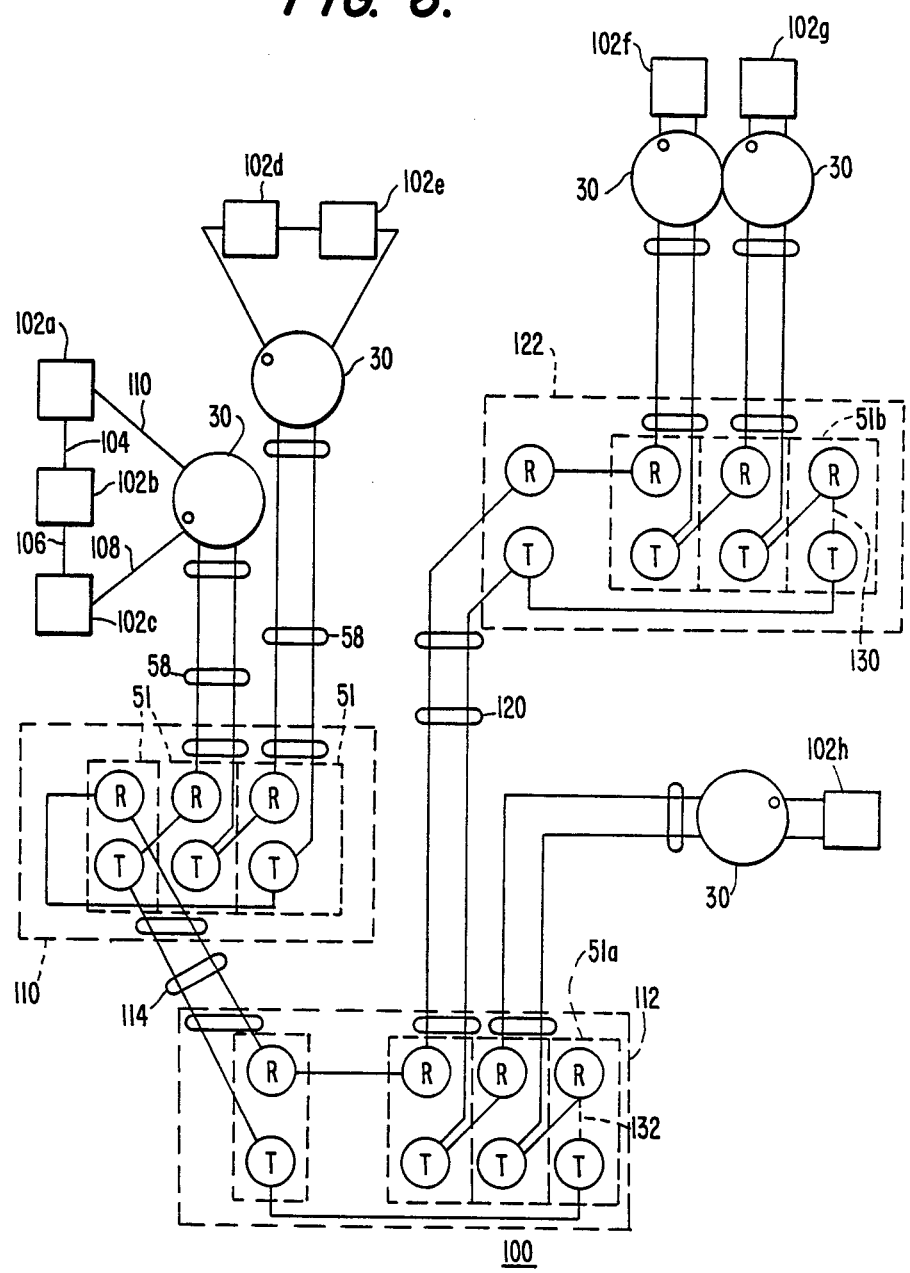
FIG. 6 is an interconnection diagram showing a computer system which includes the device of FIGS. 3–5.

FIG. 6 shows a computer system 100 in which a plurality of computers 102a–102h designed for use with coaxial cable, are interconnected in a loop using 150 ohm dual twisted pair cables. Computers 102a, 102b, and 102c are interconnected in a local loop using 75 ohm coaxial cables 104, 106, 108, and 110. Coaxial cables 108 and 110 are connected to BNC terminals 60 and 62 (not shown) of an interconnect device 30. Connector assemblies 50 of devices 30 are connected to corresponding data connectors 51 arranged and interconnected in a patch panel 110 as shown in FIG. 6. Patch panel 110 is connected to a second patch panel 112 over a 150 ohm twisted pair transmission line 114 consisting of a two twisted conductor pairs. Patch panels 110 and 112 may be separated by several thousand feet. As shown in FIG. 6, each data connector 51 includes an individual terminal R which receives input data from a corresponding twisted conductor pair and a terminal T which transmits output data over a corresponding twisted conductor pair.

Patch panels 110 and 112, as well as transmission line 114 are installed in a building during construction of the building. Patch panel 112 includes a plurality of data connectors 51. One data connector 51 of patch panel 112 is connected over a 150 ohm twisted pair transmission line 120 to a third patch panel 122. Computers 102f and 102g are each connected through interconnect devices 30 to patch panel 122.

Computer 102h is connected through interconnect device 30 directly to a data connector 51 of patch panel 112. It is further to be noted that data connectors 51a and 51b of patch panels 112 and 122, respectively, do not have any 150 ohm transmission lines connected thereto. Accordingly, internal short circuiting devices of data connectors 51a and 51b cause the respective receive terminal R to be short circuited to the transmit terminal T. This is indicated at 130 and 132, respectively.

Interconnect device 30 was tested using a pair of computers 102 connected through interconnect devices 30 and a one-half mile length of 150 ohm transmission line using two twisted conductor pairs. The computers communicated normally. A one MHz square wave was also transmitted over a one-half mile length of 150 ohm transmission line through a pair of interconnect devices 30. No noticeable degradation or distortion was observed.

Use of interconnect devices 30 allows the operation of computers 102 which normally communicate over 75 ohm unbalanced coaxial line with a cable network employing 150 ohm twisted pair transmission lines. Thus, the device avoids the necessity to install a separate coaxial transmission network in parallel with an existing 150 ohm twisted pair transmission network.

It will be apparent to those skilled in the art that various modifications and variations can be made in the apparatus and method of the present invention. Thus it is intended that the specification and drawings be considered as exemplary only, with the true scope and spirit of the invention being indicated by the following claims.

We claim:

1. Apparatus for interconnecting a computer to a network comprising:
   a housing of conductive material;
   a pair of toroidal transformers mounted in said housing, each of said transformers comprising a toroidal core of ferrite material, a balanced winding, and an unbalanced winding;
   a pair of first connection means for receiving a balanced conductor, each of said first connection means being connected to a separate one of said balanced windings; and
   a pair of second connection means mounted on said housing for receiving an unbalanced conductor, each of said second connection means being connected to a separate one of said unbalanced windings.

2. Apparatus as recited in claim 1 wherein said housing comprises a Faraday shield between said transformers.

3. Apparatus as recited in claim 1 wherein said windings are helically wound.

4. Apparatus as recited in claim 1 wherein said pair of second connection means comprises a pair of coaxial connectors.

5. Apparatus as recited in claim 4 wherein said pair of first connection means each have a characteristic impedance of 150 ohms and said coaxial connectors each have a characteristic impedance of 75 ohms.

6. Apparatus as recited in claim 5 wherein said balanced windings each have 20 turns and said unbalanced windings each have 14 turns.

7. Apparatus as recited in claim 6 wherein said balanced windings are each formed of 30-gauge wire and said unbalanced windings are each formed of 26-gauge wire.

* * * * *

UNITED STATES PATENT AND TRADEMARK OFFICE
CERTIFICATE OF CORRECTION

PATENT NO.    :    4,839,531

DATED         :    June 13, 1989

INVENTOR(S)   :    DUANE E. STEMMONS and JOHN P. NOONAN

It is certified that error appears in the above-identified patent and that said Letters Patent is hereby corrected as shown below:

IN THE SPECIFICATION:

Column 1, line 33, "colaxial" should be --coaxial--;
Column 1, line 37, "compatable" should be --compatible--;
Column 1, line 41, "compatable" should be --compatible--; and Column 2, line 67, "18" should be --16--.

Signed and Sealed this

Seventh Day of November, 1989

Attest:

JEFFREY M. SAMUELS

Attesting Officer     Acting Commissioner of Patents and Trademarks